(12) United States Patent
Seok

(10) Patent No.: US 8,648,399 B2
(45) Date of Patent: Feb. 11, 2014

(54) BIPOLAR JUNCTION TRANSISTOR FOR CURRENT DRIVEN SYNCHRONOUS RECTIFIER

(75) Inventor: Kyoung Wook Seok, Milpitas, CA (US)

(73) Assignee: IXYS Corporation, Milpitas, CA (US)

( * ) Notice: Subject to any disclaimer, the term of this patent is extended or adjusted under 35 U.S.C. 154(b) by 172 days.

(21) Appl. No.: 13/299,340

(22) Filed: Nov. 17, 2011

(65) Prior Publication Data

US 2013/0127017 A1      May 23, 2013

(51) Int. Cl.
*H01L 27/06* (2006.01)
(52) U.S. Cl.
USPC .......................................................... 257/277
(58) Field of Classification Search
USPC ................................... 257/275, 277, 477, 577
See application file for complete search history.

(56) References Cited

U.S. PATENT DOCUMENTS 5,693,543 A * 12/1997 Yoshihisa et al. ............. 438/325
6,596,600 B1 * 7/2003 Gomi ............................ 438/323

* cited by examiner

*Primary Examiner* — Thomas L Dickey
(74) *Attorney, Agent, or Firm* — Imperium Patent Works; T. Lester Wallace; Darien K. Wallace

(57) ABSTRACT

A Reverse Bipolar Junction Transistor (RBJT) integrated circuit comprises a bipolar transistor and a parallel-coupled distributed diode. The bipolar transistor involves many N-type collector regions. Each N-type collector region has a central hole so that P-type material from an underlying P-type region extends up into the hole. A collector metal electrode covers the central hole forming a diode contact at the top of the hole. When the distributed diode conducts, current flows from the collector electrode, down through the many central holes in the many collector regions, through corresponding PN junctions, and to an emitter electrode disposed on the bottom side of the IC. The RBJT and distributed diode integrated circuit has emitter-to-collector and emitter-to-base reverse breakdown voltages exceeding twenty volts. The collector metal electrode is structured to contact the collector regions, and to bridge over the base electrode, resulting in a low collector-to-emitter voltage when the RBJT is on.

19 Claims, 16 Drawing Sheets

CROSS-SECTIONAL TOP-DOWN AND SIDE
VIEWS OF RECTANGLE 122 OF FIG. 30

FLYBACK CONVERTER

FLYBACK CONVERTER

SILICON DIODE

SCHOTTKY DIODE

BJT (IF $I_B = 0.1 \cdot I_{RATED}$)

| | $V_T$ | $V_F$ |
|---|---|---|
| SILICON DIODE | 0.7 | 1.0 |
| SCHOTTKY DIODE | 0.4 | 0.7 |
| BJT (IF $I_B = 0.1*I_{RATED}$) | 0.1 | 1.0 |
| RBJT (IF $I_B = 0.1*I_{RATED}$) | 0.7 | 0.1 |

FLYBACK CONVERTER

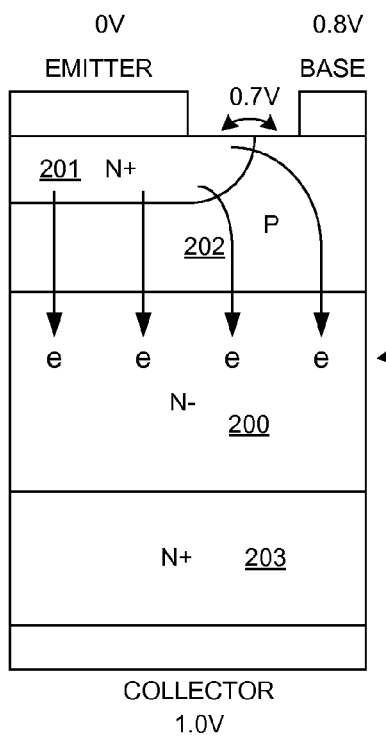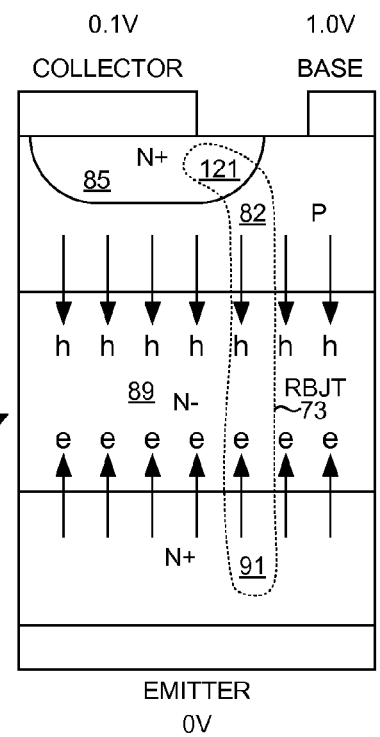
CONVENTIONAL BJT
(AT I$_{RATED}$)
FIG. 19
RBJT
(AT I$_{RATED}$)
FIG. 20

CONVENTIONAL DIODE

RBJT

TRANSFORMER
CONCEPTUAL DIAGRAM

TRANSFORMER (PERSPECTIVE VIEW)

LOW FORWARD VOLTAGE RECTIFIER

LOW FORWARD VOLTAGE RECTIFIER

| REGION | TYPE | DOPANT | FORMATION | DOPING CONCENTRATION (ATOMS/CCM) | JUNCTION DEPTH (MICRONS) |
|---|---|---|---|---|---|
| COLLECTOR REGIONS | N | PHOSPHORUS | DIFFUSION FROM SURFACE | 2E20 AT SURFACE | 0.8 |
| BASE REGION | P | BORON | DIFFUSION FROM SURFACE | 2E19 AT SURFACE | 1.4 |
| LIGHTLY DOPED LAYER | N | PHOSPHORUS | EPI GROWN FROM SUBSTRATE | 3E15 | 2.5 TO 3.5 |
| EMITTER LAYER | N | PHOSPHORUS | SUBSTRATE | 3E18 | |

DOPING PROFILE FOR 50V BREAKDOWN
RBJT/DIODE INTEGRATED CIRCUIT

BIPOLAR JUNCTION TRANSISTOR FOR CURRENT DRIVEN SYNCHRONOUS RECTIFIER

TECHNICAL FIELD

The described embodiments relate to rectifiers, and more particularly to rectifiers for flyback power supplies.

BACKGROUND INFORMATION

FIG. 1 (Prior Art) is a simplified circuit diagram of a flyback converter power supply 1. Flyback converter 1 generates a 5.0 volt DC voltage from a 110 volt AC source. 110 volts AC supplied from source 2 is present between connectors 3 and 4. The 110 volt AC voltage is rectified by a full wave bridge rectifier comprising diodes 5-8. Capacitor 9 is a smoothing capacitor. A rough DC voltage $V_{IN}$ of approximately the 150 volt peak voltage of the 110 volt AC RMS input signal is present on conductor and node 10. A switch 11 is rapidly switched on and off to pull pulses of current through the primary 12 of a transformer 13 from this $V_{IN}$ conductor. When a pulse of current is pulled through the primary 12, an amount of energy is stored in the transformer. When the switch 11 is then opened, a pulse of current is made to flow from the secondary 14 so that energy stored in the transformer is transferred to the load 15. The current from the secondary 14 flows through a rectifier diode 16. Such pulses of current keep charge on a storage capacitor 17 so that the desired 5.0 volts DC is maintained across load 15 between $V_{OUT}$ conductor 18 and ground conductor 19. Standard sensing and control circuitry that controls the switching of switch 11 is not illustrated in order to simply the diagram. The flyback topology of FIG. 1, including its sensing and control circuitry, is well known in the art.

FIG. 2 (Prior Art) is a set of simplified waveform diagrams. These diagrams set forth waveforms of voltages and currents present in the circuit of FIG. 1. The upper waveform labeled $V_S$ shows the voltage present across switch 11. From time $t_0$ to time $t_1$, switch 11 is closed. Current is flowing from node 10, through the primary 12, and through switch 11, and to ground node and conductor 20. From time $t_0$ to time $t_1$ this current increases as illustrated in the waveform labeled $I_S$. From time $t_0$ to time $t_1$, energy is being stored in the transformer. Switch 11 is closed. Accordingly, the voltage across switch 11 is zero. Magnetic flux is building in the transformer as indicated by the waveform labeled "MAGNETIC FLUX". Then at time $t_1$, switch 11 is opened. The opening of switch 11 causes a current to stop flowing in the primary, and to start flowing in the secondary. As illustrated in the fourth waveform labeled $I_D$, this current flowing in the secondary decreases over time. The magnetic flux in the transformer decreases as well. At time $t_2$, there is no more energy stored in the transformer and the secondary current stops flowing. From time $t_2$ to time $t_3$, there is little or no current flow in either the primary or the secondary of the transformer as indicated by the $I_S$ and $I_D$ waveforms. The switching cycle repeats at time $t_0$ when switch 11 is closed again to start the next cycle. The switching period from time $t_0$ of one period to time $t_0$ of the next period may, for example, be ten microseconds.

FIG. 3 (Prior Art) illustrates current flow from time $t_2$ to time $t_0$. Reference numeral 21 identifies the split core of transformer 13. FIG. 4 (Prior Art) illustrates current flow from time $t_0$ to time $t_1$. FIG. 5 (Prior Art) illustrates current flow from time $t_2$ to time $t_2$.

When current is flowing from the secondary winding of the transformer and to capacitor 17 and load 15, the current is flowing through rectifier diode 16. The rectifier diode 16 being in the current path results unwanted power dissipation. At a given time, the instantaneous power dissipated in rectifier diode 16 is the product of the instantaneous current flow through the diode and the instantaneous voltage being dropped across the diode. Average power dissipation in rectifier diode 16 is the average of such instantaneous power dissipation taken over the entire switching cycle of the flyback converter. In a common conventional flyback converter that outputs 20 amperes at 5.0 volts DC such as the flyback converter illustrated in FIG. 1, the forward voltage drop $V_F$ of the rectifying diode at its rated current flow is approximately 1.0 volts. Average power dissipation in the rectifying diode may be approximately 15 Watts.

SUMMARY

A Low Forward Voltage Rectifier (LFVR) in an easy-to-employ two-terminal TO-247 package comprises a first package terminal, a second package terminal, a bipolar transistor, a parallel diode, and a base current injection circuit. The collector of the bipolar transistor is coupled to the first package terminal. The emitter of the bipolar transistor is coupled to the second package terminal. The parallel diode is coupled between the collector and the emitter of the bipolar transistor so that the anode of the diode is coupled to the collector and the cathode of the diode is coupled to the emitter. The base current injection circuit injects a base current into the bipolar transistor in forward bias conditions (conditions in which the voltage on the first package terminal is greater than the voltage on the second package terminal) such that the voltage drop from the first package terminal to the second package terminal is substantially less than 0.7 volts when a current greater than a predetermined current is flowing from the first package terminal to the second package terminal. The forward voltage drop from the first to second package terminals may be approximately 0.1 volts.

In one example, if current flow from the first package terminal to the second package terminal is less than the predetermined current under forward bias conditions, then the voltage drop from the first package terminal to the second package terminal is limited by the diode to be approximately 0.8 volts. In reverse bias conditions (conditions in which the voltage between the first package terminal and the second package terminal is negative), the LFVR blocks current flow.

In one example, the base current injection circuit involves a current transformer. The current transformer has a first winding and a second winding wrapped around a ring-shaped ferrite core. The current transformer, the bipolar transistor, and the parallel diode are interconnected such that the second winding is in the current path of the collector current of the bipolar transistor. The first winding is coupled to supply a base current to the base of the bipolar transistor. In one specific case, the base current $I_B$ supplied by the first winding of the current transformer to the base is approximately one third of the collector current $I_C$ flowing through the second winding of the transformer. For collector currents greater than the predetermined critical collector current $I_{C\text{-}CRIT}$, the base current supplied to the bipolar transistor is adequate to keep the transistor in saturation such that $V_{CE}$ is substantially less than 0.7 volts (approximately 0.1 volts).

In one example, the bipolar transistor is a Reverse Bipolar Junction Transistor (RBJT) and the parallel diode is a distributed diode. Both the RBJT and the distributed diode are parts of a novel RBJT/diode integrated circuit. The reverse breakdown voltage from the emitter of the RBJT to the base of the RBJT is greater than 20 volts. The reverse breakdown voltage from the emitter of the RBJT to the collector of the RBJT is greater than 20 volts. The bipolar transistor involves many substantially square-shaped N-type collector regions disposed in a regular array of rows and columns. Each N-type collector region has one and only one hole. This hole is a central axial hole so that P-type material from an underlying P-type region extends up into the hole. A collector metal electrode covers the central hole thereby forming a diode contact at the top of the hole. When the distributed diode conducts, current flows from the collector electrode, down through the many central holes in the many collector regions, through corresponding PN junctions beneath the holes, and to an emitter electrode disposed on the bottom side of the integrated circuit. The PN junctions together comprise the distributed diode. The base metal electrode forms a two-dimensional grid. Metal of the base metal electrode surrounds the periphery of each N-type collector region (when considered from a top-down perspective). The collector metal electrode is structured to contact the N-type collector regions. The collector metal electrode contacts one N-type collector region, bridges up and over intervening portions of the base electrode between N-type collector regions, and extends down to contact the neighboring N-type collector region. The various neighboring N-type collector regions are interconnected in this way. This bridging collector electrode structure results in a low collector-to-emitter forward voltage when the RBJT is on and conductive.

Using the Low Forward Voltage Rectifier for the rectifying component in a flyback converter power supply reduces average power dissipation as compared to using a conventional silicon diode for the rectifying component. Reducing average power dissipation increases power supply efficiency. The easy-to-employ two-terminal TO-247 package of the LFVR allows a conventional diode in the secondary of a flyback converter to be removed and replaced with the LFVR with a minimal amount of PCB layout and power supply design changes.

Further details and embodiments and techniques are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 19 is a simplified cross-sectional diagram of a conventional bipolar junction transistor (BJT) structure.

FIG. 20 is a simplified cross-sectional diagram of the RBJT of FIG. 14.

FIG. 34 is a table that sets forth doping concentrations in the various regions and layers of the structure of the RBJT/diode integrated circuit of FIG. 30.

DETAILED DESCRIPTION

Reference will now be made in detail to background examples and some embodiments of the invention, examples of which are illustrated in the accompanying drawings.

Figure 6:
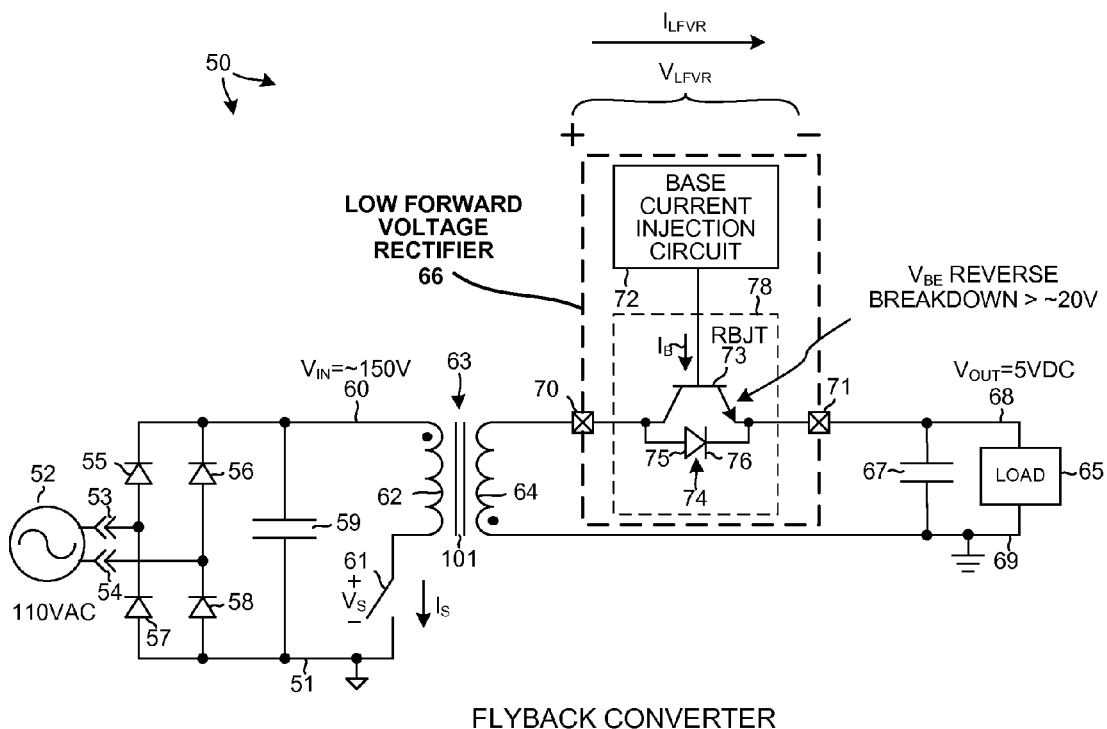
FIG. 6 is a flyback converter that includes a Low Forward Voltage Rectifier (LFVR) in accordance with one novel aspect.

FIG. 6 is a simplified circuit diagram of a flyback converter 50 in accordance with one novel aspect. Flyback converter 50 generates a 5.0 volt DC (direct current) voltage from a 110 volt AC (alternative current) source (110VAC RMS). 110 volts AC RMS supplied from source 52 is present between connectors 53 and 54. The 110 volt AC voltage is rectified by a full wave bridge rectifier comprising diodes 55-58. Capacitor 59 is a smoothing capacitor. A somewhat rough DC voltage $V_{IN}$ is present on conductor and node 60. The magnitude of $V_{IN}$ is approximately the peak voltage of the 110VAC RMS signal, which is 150 volts. A switch 61 is rapidly switched on and off to pull pulses of current through the primary winding 62 of a transformer 63. When one such pulse of current is pulled from node 60, through the primary winding 62, through switch 61, and to ground node and conductor 51, an amount of energy is stored in the transformer. When switch 61 is then opened current stops flowing in the primary winding 62, but a pulse of current is then made to flow from the secondary winding 64 so that energy previously stored in the transformer is then transferred to the load 65. The current from the secondary winding 64 flows through a novel Low Forward Voltage Rectifier 66 (LFVR). Such pulses of secondary current keep a storage capacitor 67 charged so that the desired 5.0 volts DC is maintained across load 65 between $V_{OUT}$ conductor 68 and ground conductor 69. Sensing and control circuitry that controls the switching of switch 61 is not illustrated in order to simply the diagram. Many suitable sensing and control circuits for controlling switch 61 are known in the art.

In the illustrated example, LFVR 66 comprises a first package terminal 70, a second package terminal 71, a base current injection circuit 72, a Reverse Bipolar Junction Transistor (RBJT) 73, and a parallel diode 74, interconnected as illustrated in FIG. 6. The anode 75 of the diode 74 is coupled to the collector of RBJT 73. The cathode 76 of the diode 74 is coupled to the emitter of RBJT 73. The voltage from the first package terminal 70 to the second package terminal 71 is denoted $V_{LFVR}$. The current flow from the first package terminal 70 to the second package terminal 71 is denoted $I_{LFVR}$. The base current injection circuit 72 functions to inject an adequate base current $I_B$ into RBJT 73 so that when current $I_{LFVR}$ is flowing the voltage drop (from terminal 70 to terminal 71) is substantially lower than 0.7 volts (for example, about 0.1 volts) throughout as much of the time from time $t_1$ to time $t_2$ as possible.

Figure 7:
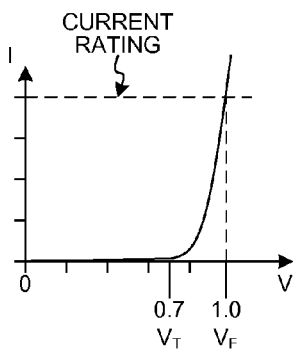
FIG. 7 is a diagram of the IV characteristic of a silicon diode.

FIG. 7 is a diagram showing the IV curve for an ordinary silicon diode where the junction is a semiconductor-semiconductor junction. The diode starts to conduct current when a positive voltage of approximately 0.7 volts (denoted $V_T$) is present from its anode to its cathode. When a positive voltage is present across the diode from its anode to its cathode, and the diode is conducting at its rated current, then the forward voltage drop across the diode is about 1.0 volts. This voltage drop is denoted $V_F$. When the diode is reverse biased (a negative voltage is present from its anode to its cathode), then the diode effectively blocks current flow for negative voltages that are not too high. This is the type of diode commonly used for the rectifier diode in a conventional flyback converter.

Figure 8:
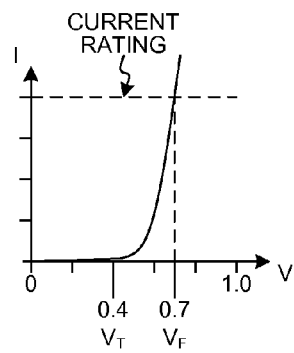
FIG. 8 is a diagram of the IV characteristic of a Schottky diode.

FIG. 8 is a diagram showing the IV curve for another type of diode referred to as a Schottky diode where the junction is a metal-semiconductor junction. As shown, the Schottky diode begins to conduct current at a lower positive voltage $V_T$ of 0.4 volts between its anode and its cathode. The Schottky diode has a lower forward voltage $V_F$ of 0.7 volts at the rated current of the diode.

Figure 9:
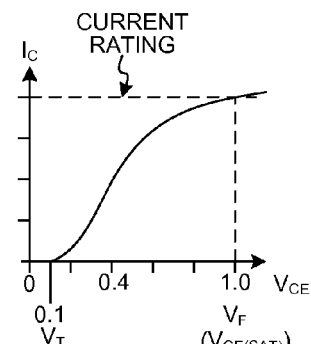
FIG. 9 is a diagram of the $V_{CE}$ to $I_C$ characteristic of a bipolar conventional BJT, provided that an adequately large base current is supplied to the BJT.

FIG. 9 is a diagram showing the collector-to-emitter voltage VCE drop across an ordinary bipolar transistor as a function of collector current IC. The curve of FIG. 9 assumes that the base current IB is adequately large to keep the transistor in saturation. In the example, the base current IB is one tenth of the rated collector current. Note that the voltage drop VCE is about 1.0 volt at the rated collector current.

If the silicon diode of FIG. 7 were used as the rectifier component in the secondary of a flyback converter, then there would be a 1.0 voltage drop across the diode when a pulse of secondary current is flowing through the diode at the diode rated current. This voltage drop would correspond to a high power dissipation. Similarly, if the Schottky diode of FIG. 8 were used as the rectifier component in the secondary of a flyback converter, then there would be a 0.7 voltage drop across the diode when a pulse of secondary current is flowing through the diode at the diode rated current. This voltage drop would correspond to an undesirably high power dissipation as well. Similarly, if the ordinary bipolar transistor of FIG. 9 were used as the rectifier component in the secondary of a flyback converter, then there would be a 1.0 $V_{CE}$ voltage drop across the transistor when the pulse of secondary current is flowing through the transistor at the rated current. This 1.0 volt $V_{CE}$ voltage drop would correspond to a high power dissipation.

Figures 10, 11:
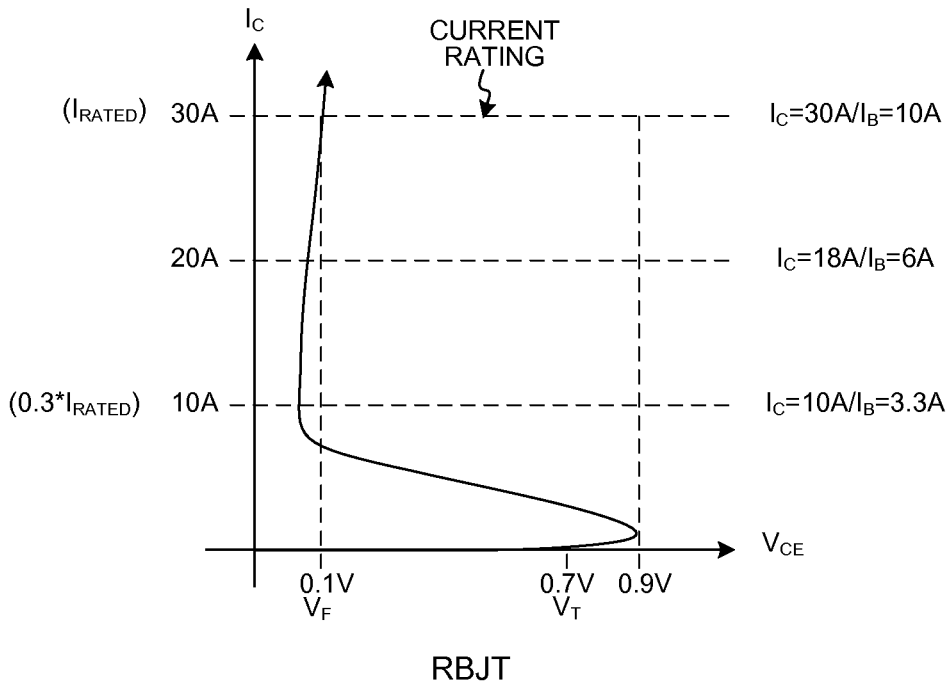
FIG. 10 is a diagram of the $V_{CE}$ to $I_C$ characteristic of a Reverse Bipolar Junction Transistor (RBJT), provided that an adequately large base current is supplied to the RBJT.
FIG. 11 is a table that sets forth $V_F$ and $V_T$ for various different types of rectifying components.

FIG. 10 is a diagram showing the collector-to-emitter voltage $V_{CE}$ drop across RBJT 73 of the Low Forward Voltage Rectifier (LFVR) 74 of FIG. 6, where the base current $I_B$ is maintained at one third of the collector current $I_C$. RBJT 73 starts conducting collector current $I_C$ at a collector-to-emitter voltage $V_{CE}$ of about 0.7 volts. As the collector current increases, the $V_{CE}$ across RBJT 73 increases up to about 0.9 volts for very low collector currents. As the collector current increases further, however, the $V_{CE}$ across the transistor decreases rapidly. For a collector current equal to one third of the rated collector current $I_{RATED}$, the $V_{CE}$ is less than 0.1 volts. Further increases in collector current $I_C$ up to the RBJT rated collector current $I_{RATED}$ only slightly increases the $V_{CE}$ across the RBJT. For a collector current equal to the rated collector current $I_{RATED}$, the $V_{CE}$ is approximately 0.1 volts (denotes forward voltage $V_F$) as illustrated. In the illustrated example, $I_{RATED}$ is 30 amperes.

FIG. 11 is a table that sets forth the forward bias voltages $V_T$ where the various rectifiers begin to conduct forward current. FIG. 11 also shows the voltage drops $V_F$ across the various rectifiers when the rectifiers are conducting at their rated currents.

Figure 12:
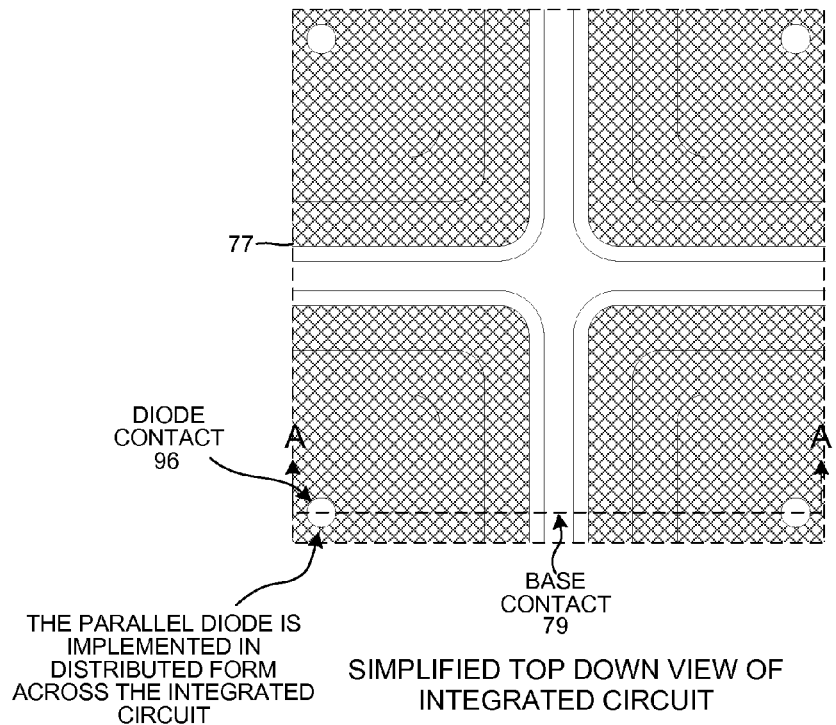
FIG. 12 is a top-down schematic diagram of a square portion of an integrated circuit in accordance with one novel aspect. The integrated circuit includes both the RBJT and the distributed parallel diode in integrated form.

FIG. 12 is a simplified top down diagram of a square portion 77 of RBJT 73 and parallel diode 74. RBJT 73 and parallel diode 74 are integrated to be parts of the same RBJT/diode integrated circuit 78. The square portion 77 illustrated in FIG. 12 is replicated many times in rows of adjacent squares and columns of adjacent squares across the integrated circuit 78. From a top-down perspective, the base contact 79 has a two-dimensional grid structure of horizontally extending metal strips of the base contact and vertically extending metal strips of the base contact. Within each of the squares formed by this two-dimensional grid structure is a square N-type collector region. RBJT/diode integrated circuit 78 involves approximately one hundred copies of the square illustrated in FIG. 12.

Figure 13:
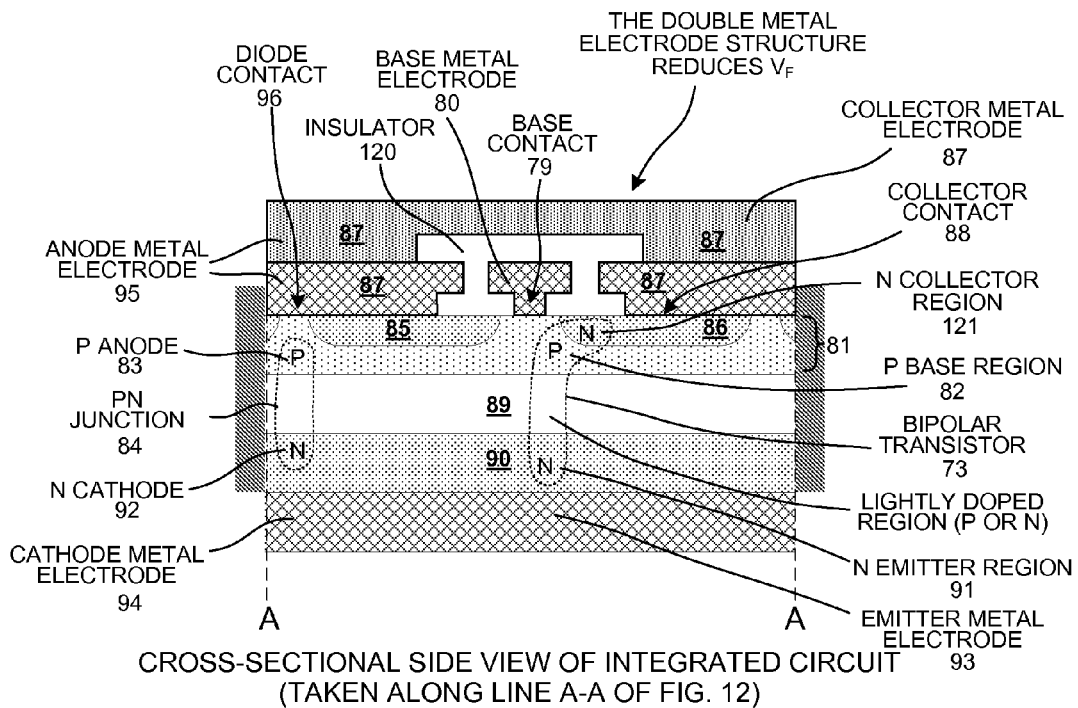
FIG. 13 is a cross-sectional side view taken along sectional line A-A of the square of FIG. 12.

FIG. 13 is a cross-sectional side view taken along sectional line A-A in FIG. 12. A base metal electrode 80 makes electrical contact with P-type layer 81 at base contact 79. A part 82 of the P-type layer 81 serves as the P-type base region of RBJT 73, and another part 83 of the P-type layer serves as the P-type anode of a PN junction 84. In a case where lightly doped region 89 is P-type the actual PN junction of the diode will be the interface between regions 89 and 90, whereas in a case where lightly doped region 89 is N-type the actual PN junction of the diode will be the interface between regions 81 and 89. N-type collector regions 85 and 86 extend down into the P-type layer 81 from the upper surface of the semiconductor material. A collector metal electrode 87 makes contact with these N-type collector regions at a collector contact 88. The collector metal electrode 87 also serves as an anode metal electrode 95 and makes contact with the P-type anode 83 of PN junction 84 at a diode contact 96. The collector metal electrode 87 bridges over the base metal electrode 80 as illustrated. An amount of insulative material 120 prevents the collector metal electrode 87 from making electrical contact with the underlying base metal electrode 80. This double metal electrode structure involving a collector metal electrode that bridges over a base metal electrode allows the RBJT to have a lower forward voltage $V_F$ as compared to a single metal layer structure involving interdigitated base and collector electrodes.

A lightly doped layer 89 is disposed under the P-type region 81. An N-type layer 90 is disposed under the lightly doped layer 89. A part 91 of the N-type layer 90 serves as the emitter region of RBJT 73, whereas another part 92 of the N-type layer 90 serves as the N-type cathode 92 of PN junction 84. The entire bottom surface of the semiconductor material is covered with a layer of metal that serves as an emitter metal electrode 93 and as a cathode metal electrode 94. Note that each diode contact (a contact from metal electrode 87 and 95 down to a PN junction below) appears as a circle in the top-down perspective of FIG. 12. The parallel diode 74 illustrated as a symbol in FIG. 6 actually comprises many PN junctions, each having a separate circle-shaped diode contact. PN junction 84 of FIG. 13 is one of these many PN junctions. These many PN junctions are distributed across the integrated circuit. This structure involving many PN junctions distributed across the integrated circuit is referred to as a distributed diode structure. The distributed diode structure provides better heat balancing as compared to a structure where the parallel diode is realized as a single non-distributed junction that is located in only one localized part of the integrated circuit.

Figure 14:
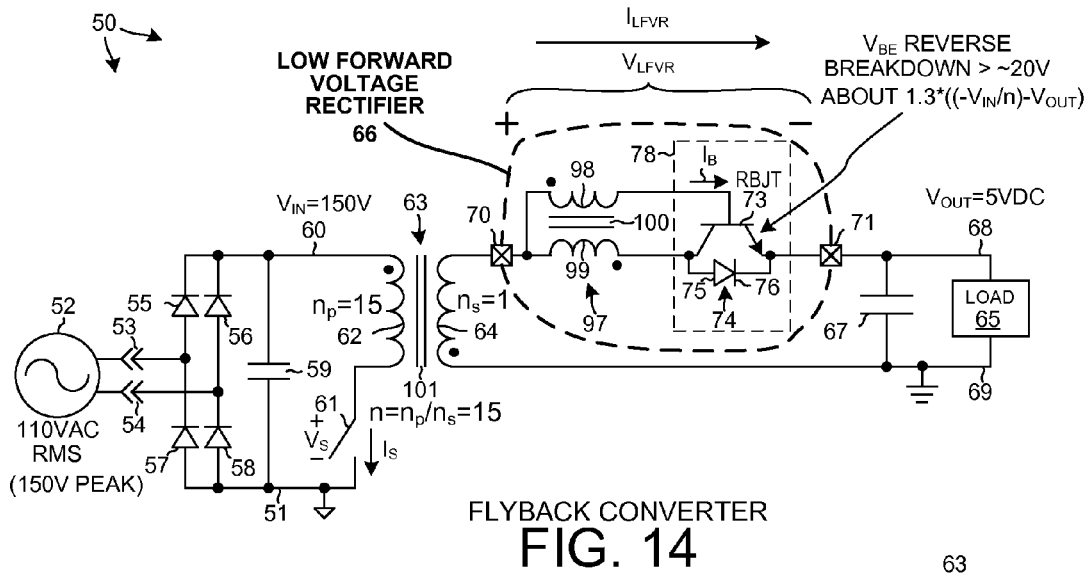
FIG. 14 is a diagram of the fly-back converter of FIG. 6, but with a specific implementation of the LFVR.

FIG. 14 is a diagram of the fly-back converter 50 of FIG. 6 but with a specific implementation of LFVR 66 shown. The implementation of LFVR 66 of FIG. 14 involves a current transformer 97 and the RBJT/diode integrated circuit 78. Current transformer 97 includes a first winding 98, a second winding 99, and a ferrite core 100. The number of turns of the first winding 98 is at least twice as large (for example, three times as large) as the number of turns of the second winding 99. As indicated by the dots on the ends of the winding symbols in FIG. 14, the first and second windings 98 and 99 are wound with respect to one another such that an increase in current in the second winding results in an increase in current in the first winding.

In the example of FIG. 14, the only electrical circuit component in the path of the collector current is an inductive element (the second winding of current transformer 97). There is no resistive or diode or voltage drop current sense element disposed in the collector current path between the first package terminal 70 and the collector of RBJT 73. There is no semiconductor material disposed in the collector current path. Similarly, there is no resistive or diode or voltage drop current sense element disposed in the current path between the emitter of RBJT 73 and the second package terminal 71. There is no semiconductor material disposed in the emitter current path.

Figure 15:
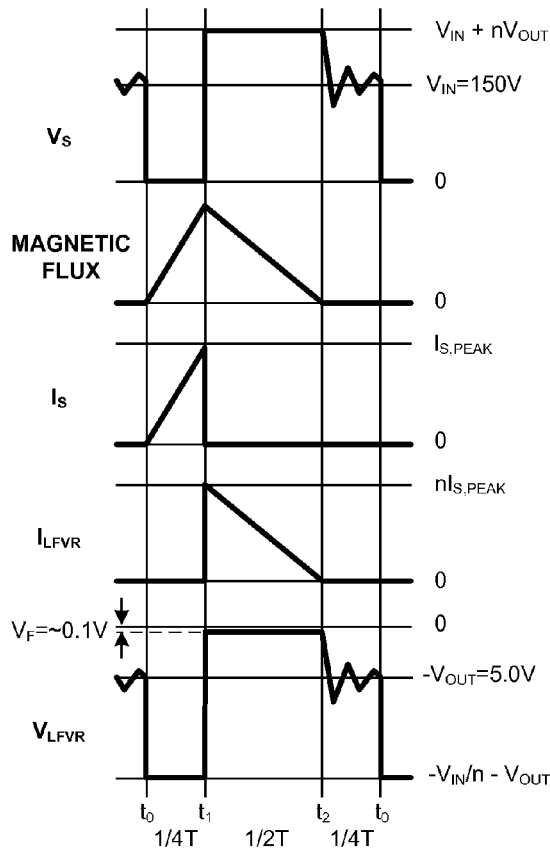
FIG. 15 is a set of waveform diagrams that shows voltages and currents in the fly-back converter of FIG. 14.

FIG. 15 is a set of waveform diagrams that shows voltages and currents in the fly-back converter 50 of FIG. 14. Switch 61 is closed from time $t_0$ to time $t_1$, and is open from time $t_1$ to time $t_2$ and then to time $t_0$ of the next switching cycle. When the switch 61 is closed energy is being stored in the transformer 63, and when the switch 61 is open the energy is transferred from the transformer 63 to capacitor 67 and load 65. When the switch 61 is open and current is flowing through the secondary winding 64, the forward voltage across LFVR 66 is about 0.1 volts for most of the time from time $t_1$ to time $t_2$.

Figure 16:
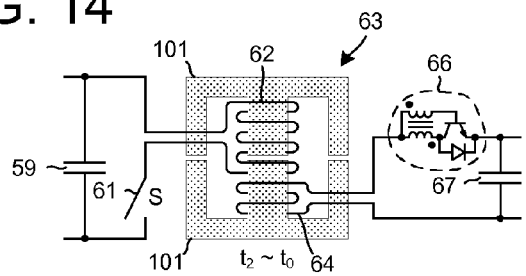
FIG. 16 illustrates current flow in the circuit of FIG. 14 from time $t_2$ to time $t_0$.
Figure 17:
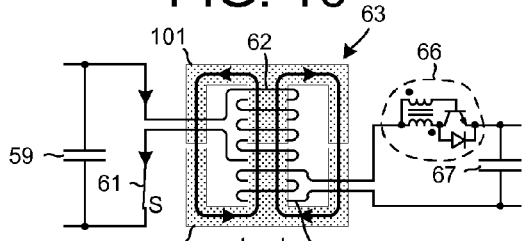
FIG. 17 illustrates current flow in the circuit of FIG. 14 from time $t_0$ to time $t_1$.
Figure 18:
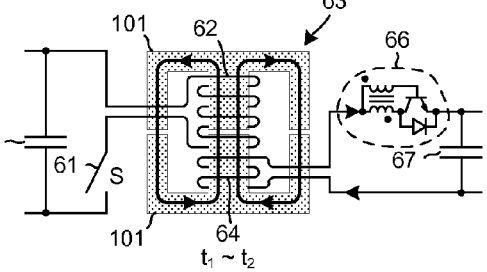
FIG. 18 illustrates current flow in the circuit of FIG. 14 from time $t_1$ to time $t_2$.

FIG. 16 illustrates current flow from time $t_2$ to time $t_0$. Reference numeral 101 identifies the split core of transformer 63. FIG. 17 illustrates current flow from time $t_0$ to time $t_1$. FIG. 18 illustrates current flow from time $t_1$ to time $t_2$.

FIG. 19 is a simplified cross-sectional diagram of a conventional bipolar junction transistor (BJT) structure. The low doped region 200 is the biggest source of conduction loss. The major charge carriers in the low doped region 200 are electrons from the emitter 201. Holes from the base 202 can enter the low doped region 200, but because the emitter voltage is lower than the voltage of the collector 203, the holes move toward the emitter 201. Because the supply of holes in the low doped region is weak and because charge neutrality must be maintained, it is difficult for the density of charge carriers in the low doped region 200 to be much higher than the doping concentration of the low doped region. Accordingly, the low doped region has a relatively high resistance. The relatively high resistance increases energy loss when the conventional BJT is conducting current at its rated current.

FIG. 20 is a simplified cross-sectional diagram of RBJT 73. The low doped region 89 has more charge carriers than the low doped region 200 in the conventional BJT structure of FIG. 19. There are both holes and electrons in low doped region 89. Holes enter the low doped region from the base 82, and electrons enter the low doped region from the emitter 91. Because the charges of these charge carriers are opposite one another, the charges cancel each other and net charge neutrality in low doped region 89 is maintained. Charge carrier density in the low doped region 89 is substantially higher than the doping concentration of the low doped region. Accordingly, the low doped region has a relatively low resistance and this relatively low resistance helps keep energy loss low when the RBJT is conducting current at its rated current.

Figure 21:
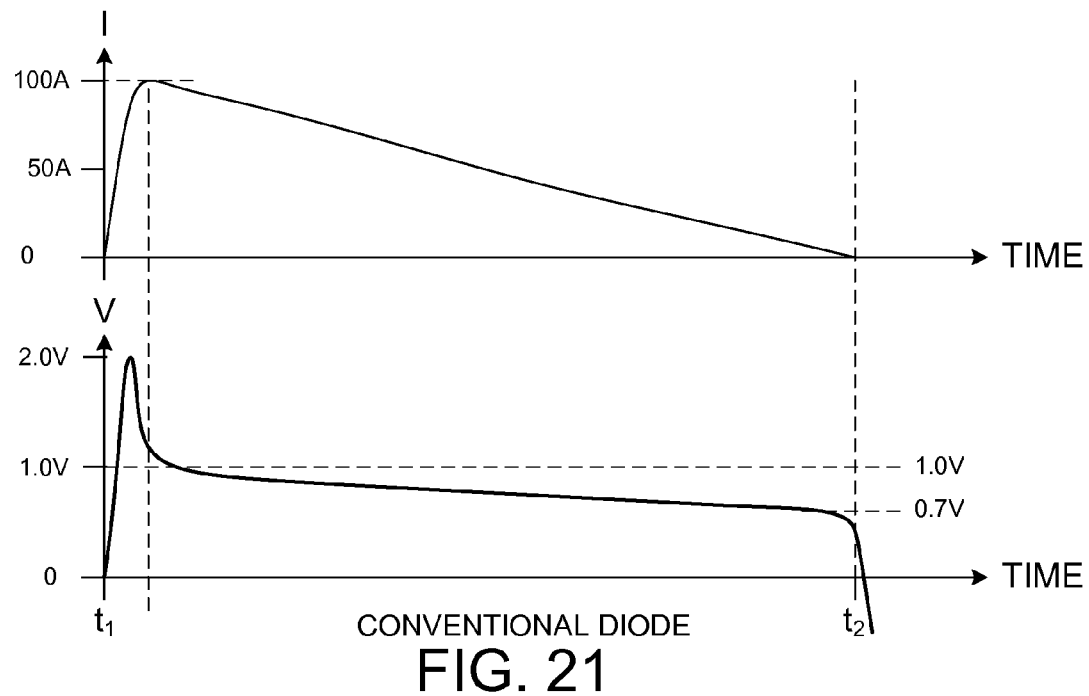
FIG. 21 is a waveform diagram showing the voltage drop across and current flow through a conventional diode if the conventional diode is used for the rectifying component in a flyback converter.

FIG. 21 is a waveform diagram for a conventional diode operating as the rectifier component in a flyback converter from time $t_1$ to time $t_2$. The time from time $t_1$ to time $t_2$ is the time when current flows through the secondary winding of the transformer and through the rectifying component. After an initial transient period, the voltage drop across the forward biased diode decreases from about 1.0 volts to about 0.7 volts at the end of the time period.

Figure 22:
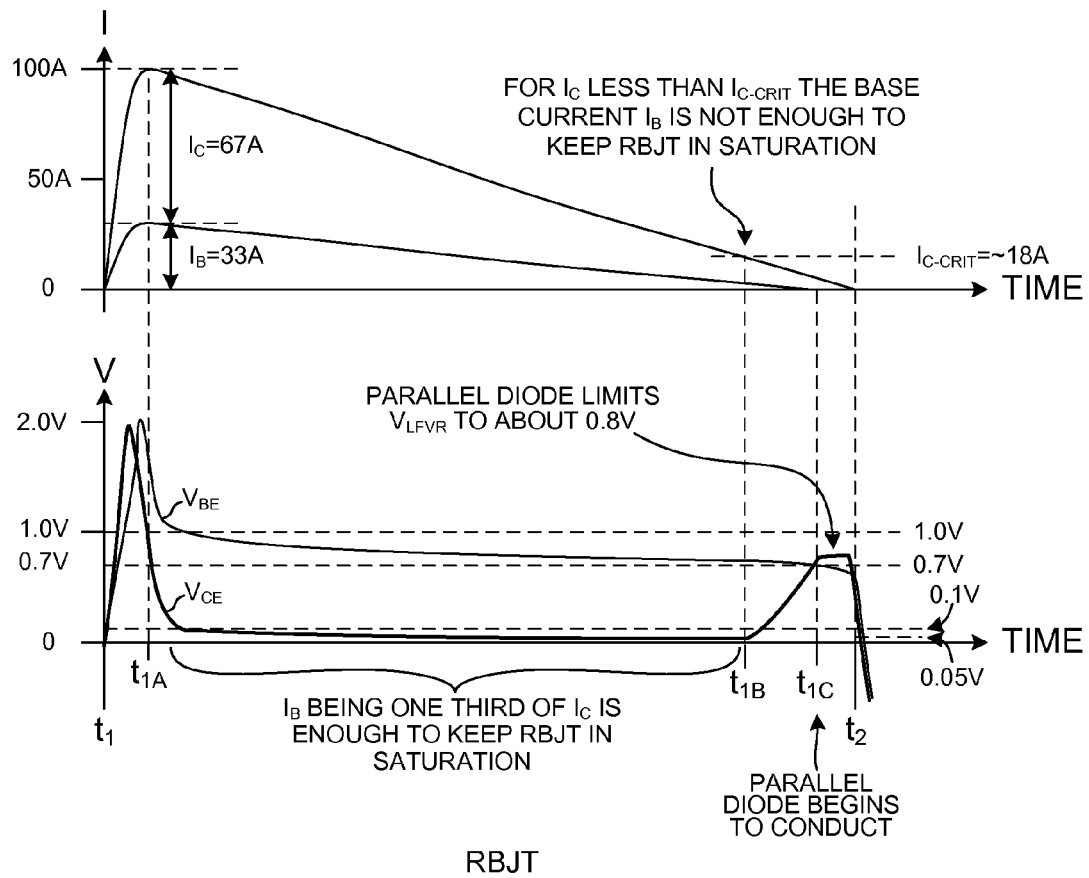
FIG. 22 is a waveform diagram showing the voltage drop across and current flow through the LFVR of FIG. 14 between time $t_1$ and time $t_2$.

FIG. 22 is a waveform diagram for RBJT 73 of LFVR 66 of FIG. 14. After an initial transient period from $t_1$ to time $t_{1A}$, the $V_{CE}$ voltage drop across RBJT 73 decreases from about 0.1 volts to about 0.05 volts. During this time from time $t_{1A}$ to time $t_{1B}$, the collector current $I_C$ and the base current $I_B$ decrease as illustrated in the upper waveform. At some point, the collector current reaches a critical current $I_{C-CRIT}$ at which the base current $I_B$ is not adequate to keep the RBJT in saturation. This is indicated to occur at time $t_{1B}$ in FIG. 22. At this time, $V_{CE}$ begins increasing. At time $t_{1C}$ the forward bias across diode 74 is large enough that diode 74 begins conducting appreciable current. Diode 74 limits the voltage $V_{LFVR}$ to about 0.8 volts. At time $t_2$ current flow through the secondary winding 64 stops, so current flow through LFVR 66 stops as well.

Figure 1:
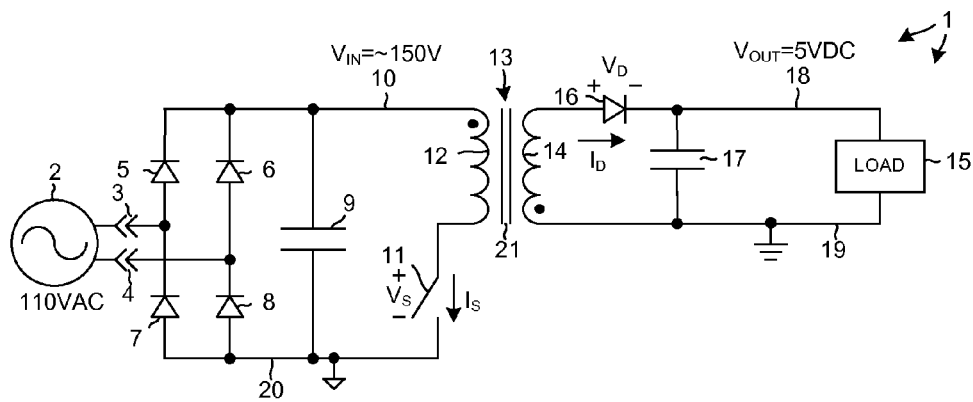
FIG. 1 (Prior Art) is a diagram of a conventional flyback converter power supply.
Figure 2:
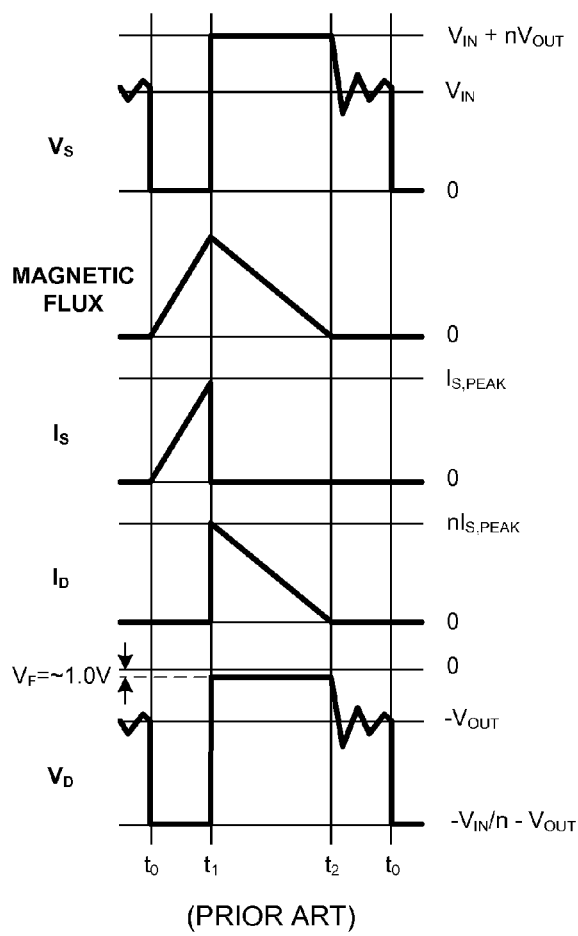
FIG. 2 (Prior Art) is a waveform diagram showing voltages and currents in the circuit of FIG. 1.
Figure 3:
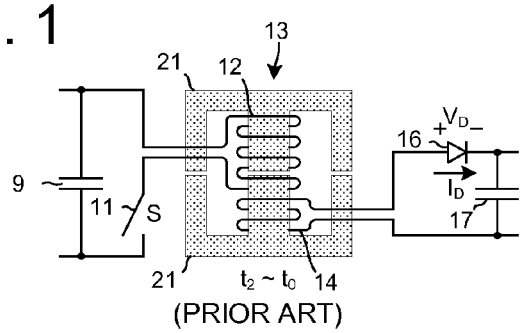
FIG. 3 (Prior Art) illustrates current flow in the conventional flyback converter of FIG. 1 from time $t_2$ to time $t_0$.
Figure 4:
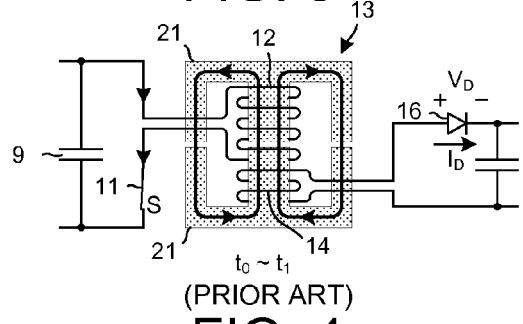
FIG. 4 (Prior Art) illustrates current flow in the conventional flyback converter of FIG. 1 from time $t_0$ to time $t_1$.
Figure 5:
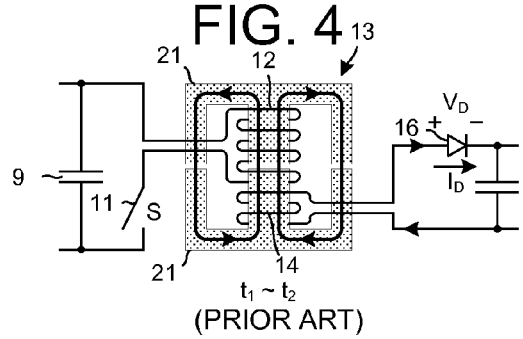
FIG. 5 (Prior Art) illustrates current flow in the conventional flyback converter of FIG. 1 from time $t_1$ to time $t_2$.
Figures 23, 24:
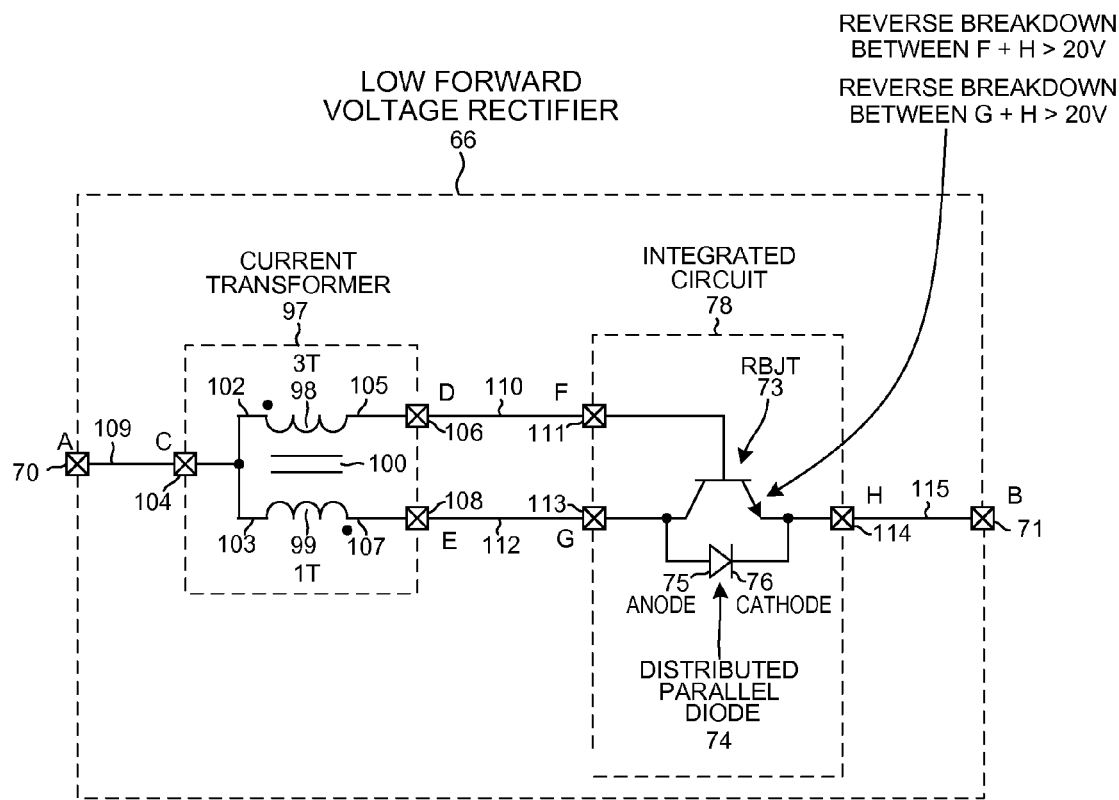
FIG. 23 is a table that compares the average power dissipation of the conventional flyback converter circuit of FIG. 1 involving a conventional silicon diode as the rectifying component to the average power dissipation of the novel flyback converter circuit of FIG. 6 involving an LFVR as the rectifying component.
FIG. 24 is a detailed diagram of a particular implementation of the LFVR of FIG. 14.

FIG. 23 is a table that compares the average power dissipation of the conventional flyback converter circuit of FIG. 1 (20 amperes out at 5.0 volts DC) involving a conventional silicon diode as the rectifying component to the average power dissipation of the novel flyback converter circuit of FIG. 6 (20 amperes out at 5.0 volts DC) involving LFVR 66 as the rectifying component. Other than the type of rectifying component, the circuit topologies of the circuits of FIG. 1 and FIG. 6 are identical.

FIG. 24 is a more detailed diagram of a particular implementation of the LFVR 66 of FIG. 14. A first end 102 of first winding 98 and a first end 103 of second winding 99 are coupled together and to a transformer terminal 104. A second end 105 of first winding 98 is coupled to a transformer terminal 106. A second end 107 of second winding 99 is coupled to a transformer terminal 108. The first winding 98 has three turns. The second winding 99 has one turn. The terminal 104 of the transformer is coupled via bond wire 109 to the first package terminal 70 of LFVR 66. The terminal 106 of the transformer is coupled via bond wire 110 to a base terminal 111 of integrated circuit 78. The terminal 108 of the transformer is coupled via bond wire 112 to a collector terminal 113 of integrated circuit 78. An emitter terminal 114 of integrated circuit 78 is coupled via conductive heat sink 115 to second package terminal 71. The conductive heat sink 115 is a portion of the metal leadframe of the package. The second package terminal 71 is a pin-shaped extension of the heat sink. Both the pin-shaped second package terminal 71 and the conductive heat sink 115 are stamped from the same piece of leadframe metal. In the diagram, A identifies first package terminal 70: B identifies second package terminal 71; C, D and E identify the three terminals of current transformer 97; F, G and H identify the three terminals of integrated circuit 78. In the illustrated example, LFVR 66 has no package terminal other than the two package terminals 70 and 71.

Figure 25:
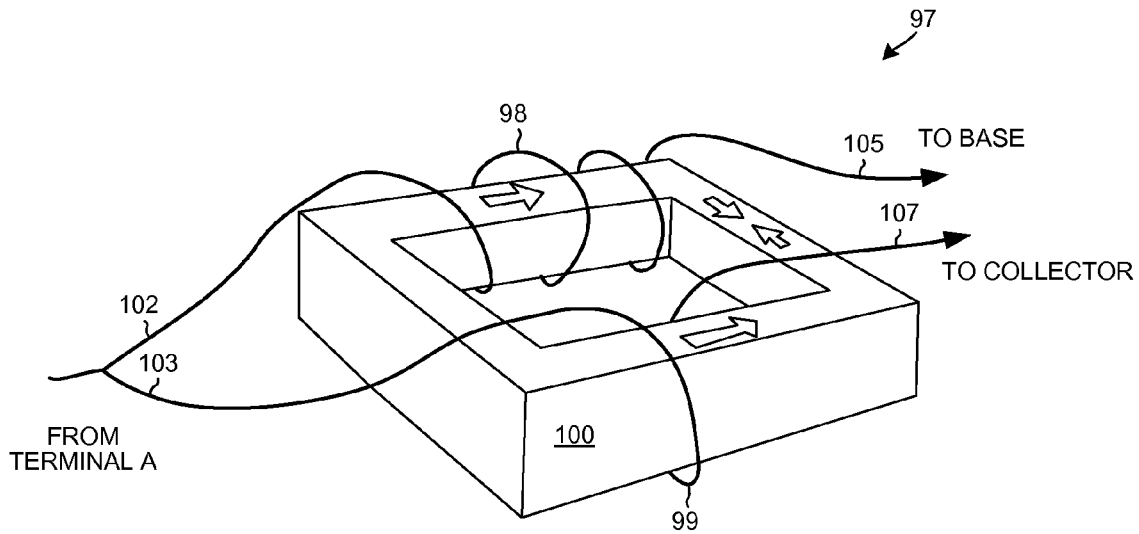
FIG. 25 is a simplified perspective conceptual diagram of the current transformer of the LFVR of FIG. 14.

FIG. 25 is a simplified perspective conceptual diagram of current transformer 97.

Figure 26:
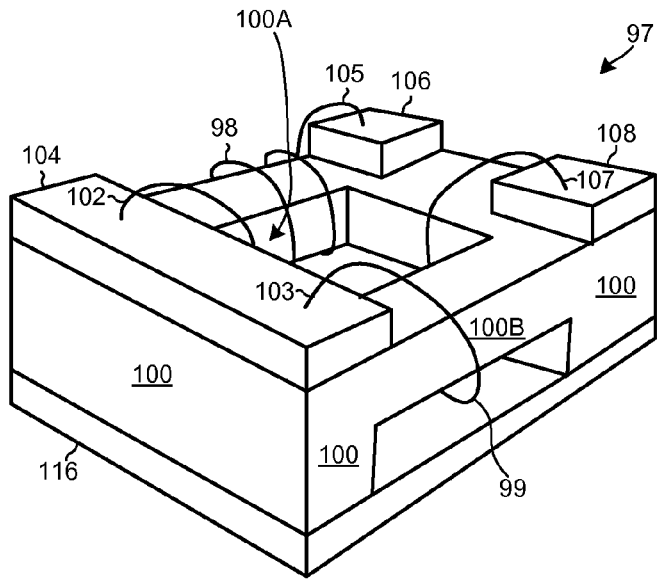
FIG. 26 is a more detailed perspective diagram of the current transformer of the LFVR of FIG. 14.

FIG. 26 is a more detailed perspective diagram of current transformer 100. An insulative spacer 116 attaches to the bottom of the ring-shaped core 100 as illustrated. The ring-shaped core 100 has bridging portions 100A and 100B that allow turns of wire to loop under and around the core between the bottom of the bridge portions and the top of the spacer 116. In one example, insulative spacer 116 is molded plastic. In another example, insulative spacer 116 is heat conductive ceramic. In another example, insulative spacer 116 two-sided insulative tape.

Figure 27:
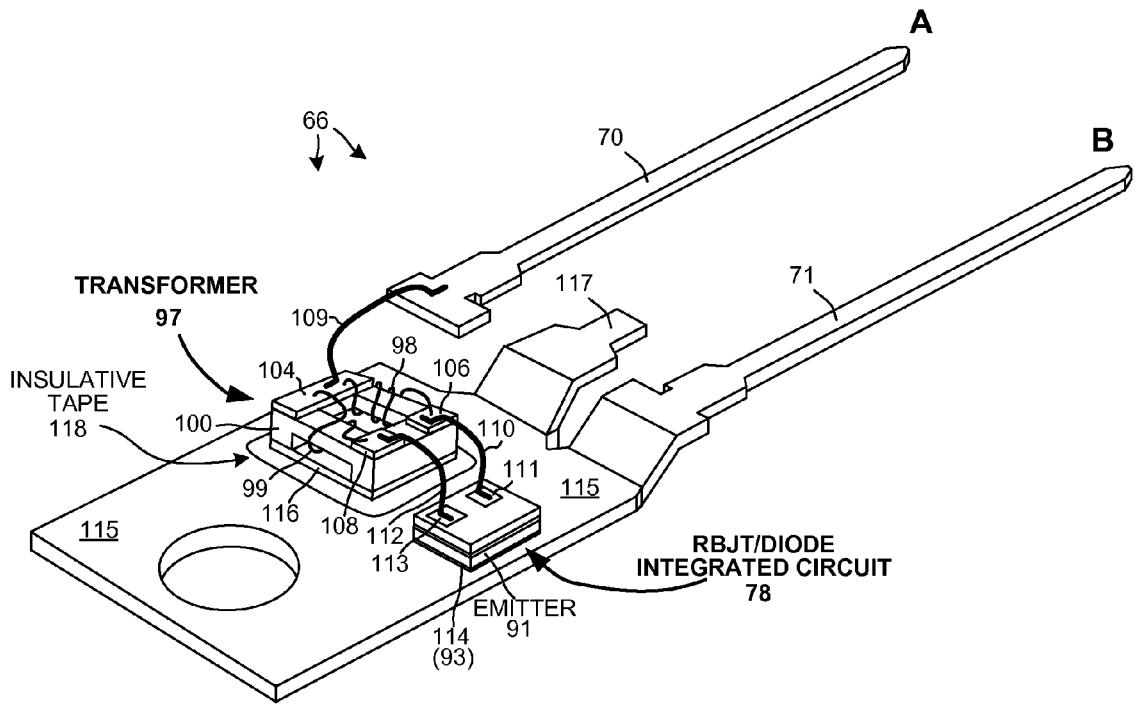
FIG. 27 is a simplified perspective view of the packaged LFVR of FIG. 14 before encapsulation.

FIG. 27 is a simplified perspective view of the packaged Low Forward Voltage Rectifier (LFVR) 66. The extension 117 of the stamped and formed copper leadframe is cut off. A piece of insulative tape 118 is disposed underneath the transformer 97 between the transformer 97 and conductive heat sink 115. In this case the insulative tape 118 is optional due to insulative spacer 116 being present.

Figure 28:
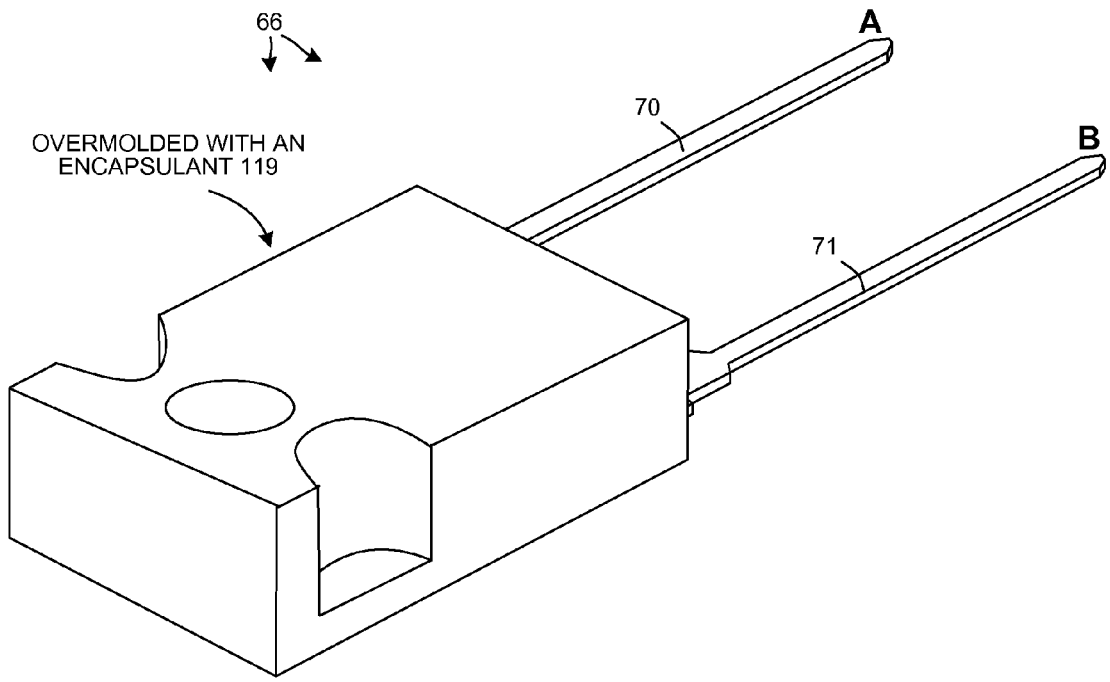
FIG. 28 is a simplified perspective view of the packaged LFVR of FIG. 14 after encapsulation.

FIG. 28 is a perspective view of the packaged LFVR 66 after the assembly has been overmolded with an injection molded plastic encapsulant 119. The packaged LFVR 66 conforms to the form factor of a standard large form factor through hold TO-247 package except that the middle terminal of the standard TO-247 package is not present.

Figure 29:
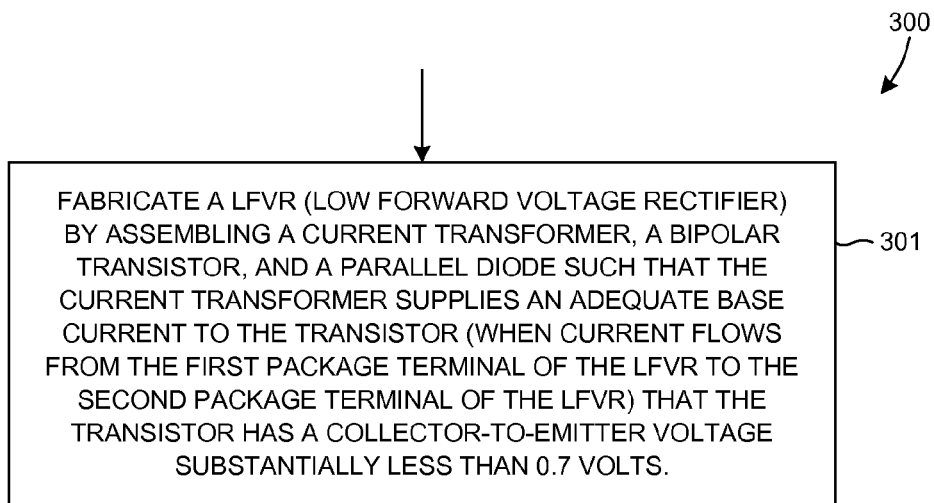
FIG. 29 is a simplified flowchart of a method 300 in accordance with one novel aspect.

FIG. 29 is a flowchart of a method 300 of manufacturing a packaged electronic device. A LFVR (Low Forward Voltage Rectifier) is fabricated (step 301) by assembling a current transformer, a bipolar transistor, and a parallel diode such that the current transformer supplies an adequate base current to the transistor (for example, $I_B=I_C/3$) when current flows (a current greater than $I_{C\text{-}CRIT}$ flows under forward bias conditions) from the first package terminal of the LFVR to the second package terminal of the LFVR, thereby causing the transistor to have a collector-to-emitter voltage substantially less than 0.7 volts (for example, 0.1 volts). In one example, the assembled LFVR is LFVR 66 illustrated in FIGS. 24, 27 and 28. The bipolar transistor is RBJT 73. The parallel diode is distributed diode 74. The RBJT and the distributed diode of the assembly are parts of the integrated circuit 78. The first package terminal is package terminal 70. The second package terminal is package terminal 71. Assembly involves surface mounting the current transformer and the integrated circuit to the heat sink portion of the leadframe, and then wire bonding the components together as illustrated in FIG. 27, and then overmolding the components to realize the finished packaged electronic device illustrated in FIG. 28.

Figure 30:
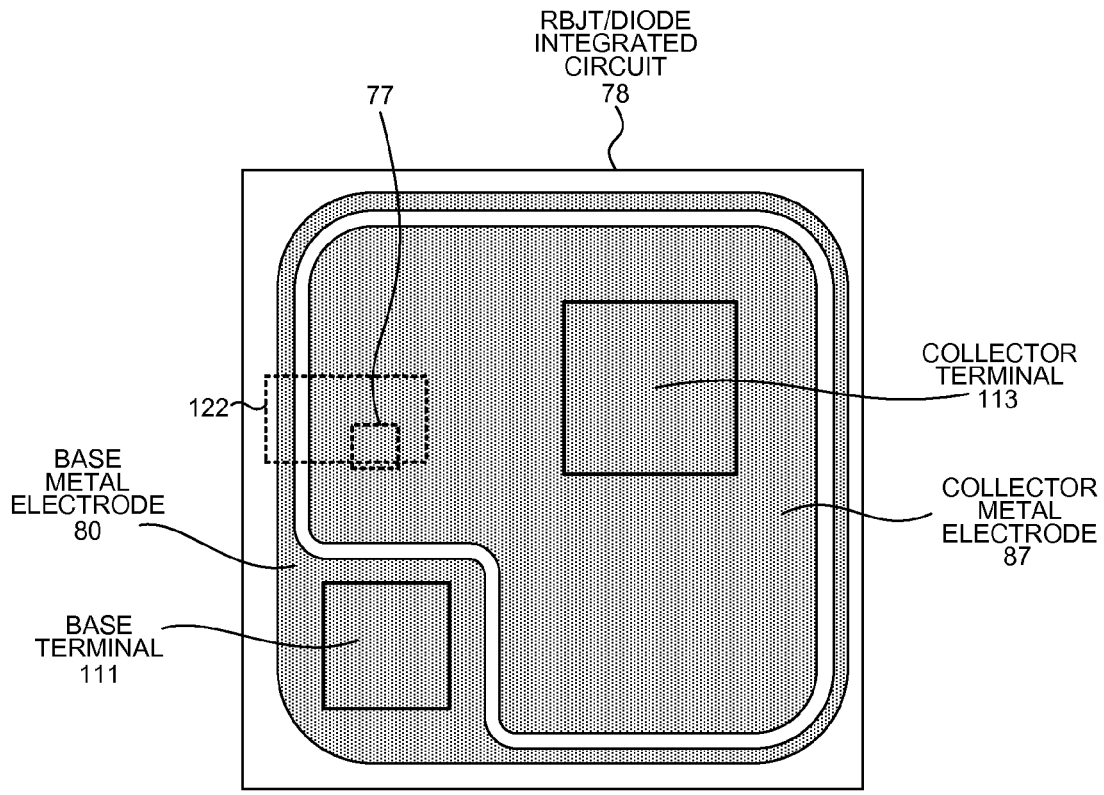
FIG. 30 is a more detailed top-down diagram of the RBJT/diode integrated circuit 78 of FIG. 14.

FIG. 30 is a top-down view of RBJT/diode integrated circuit 78. A portion of base metal electrode 80 is not covered by passivation and serves as base terminal 111. Base terminal 111 is a bond pad for wire bonding in this example. A portion of collector metal electrode 87 is not covered by passivation and serves as collector terminal 113. Collector terminal 113 is a bond pad for wire bonding in this example. The third terminal 114 of the integrated circuit is disposed on the bottom side of the integrated circuit and is therefore not shown in FIG. 30. Where the square portion 77 of FIG. 12 is located in the diagram of FIG. 30 is identified with reference numeral 77.

Figure 31:
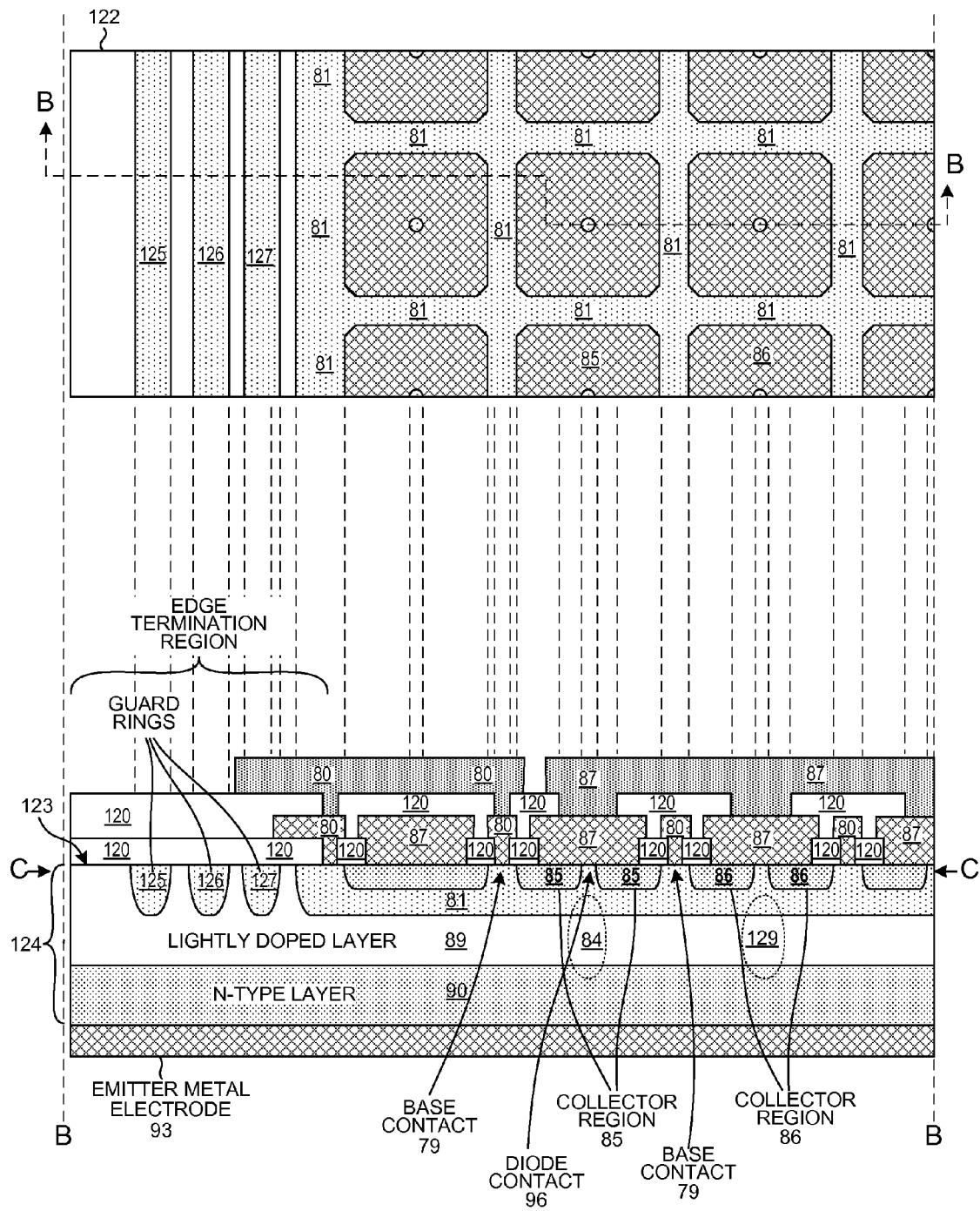
FIG. 31 is a diagram of the rectangle portion 122 of the integrated circuit 78 of FIG. 30 taken along certain sections.

FIG. 31 is a diagram that includes at the bottom a cross-sectional side view of the rectangle portion 122 of the integrated circuit shown in FIG. 30, and also includes at the top a cross-sectional top-down view of the rectangle portion 122. The cross-sectional side view at the bottom of FIG. 31 is taken along the sectional line B-B in the top view of FIG. 31. The cross-sectional top-down view at the top of FIG. 31 is taken along the sectional line C-C in the bottom view of FIG. 31.

As illustrated in the top view of FIG. 31, each of the N-type collector regions has a peripheral boundary which when viewed from the top-down perspective has a substantially square shape. Each of these substantially square-shaped N-type collector regions has one and only one hole. This hole is a central axial hole. The N-type collector region is therefore annular. The annular N-type collector region has a width of about 10.5 microns, and the diameter of the central hole is about 0.6 microns. The P-type material of P-type region 81 extends up through this central hole to the upper surface 123 of the semiconductor material. The boundary between the bottom of collector metal electrode 87 and the top of P-type region 81 at the top of this hole is a diode contact. There is one such diode contact located in the center of each N-type collector region. Collector metal electrode 87 extends over the central part of each of these N-type collector regions as shown thereby establishing a collector contact with the underlying N-type collector region. The collector metal electrode 87 also extends over the hole thereby establishing the diode contact to the corresponding underlying PN junction of the distributed diode. The collector metal electrode 87 extends from a collector contact with one collector region, up and over part of the grid-shaped base metal electrode 80, and down to the collector contact with a neighboring collector region. The N-type collector regions in the center portion of integrated circuit 78 are all interconnected by bridging collector electrode metal in this way. This bridging structure reduces the collector-to-emitter forward voltage of the bipolar transistor when the transistor is on.

When current is flowing through the distributed diode 74, current flows from collector metal electrode 87, down through the many holes in N-type collector regions, through the anode portions of P-type region 81, through lightly doped layer 89, through the cathode portions of N-type layer 90, and to electrode 93. Underneath each hole (axial hole in an N-type collector region) is what is referred to generally here as a "PN junction" even though it is understood that these PN junctions are parts of one larger PN junction. Reference numeral 84 identifies one such "PN junction". Reference numeral 129 identifies another such "PN junction". All these PN junctions of the integrated circuit together constitute the distributed diode 74 that is shown symbolically in FIG. 24.

Reference numeral 124 in FIG. 31 identifies the semiconductor portion of the integrated circuit 78. Lightly doped layer 89 is disposed over N-type emitter layer 90. In this example, lightly doped layer 89 has a thickness of about 1.5 microns. These layers 89 and 90 extend all the way across the integrated circuit 78 in the lateral dimension. P-type region 81 extends down into the semiconductor portion 124 from substantially planar upper surface 123 as shown. The substantially square-shaped N-type collector regions extend down into P-type region 81 from upper surface 123. Two of the N-type collector regions 85 and 86 are identified with reference numerals in FIG. 31. Guard rings 125, 126 and 127 of P-type material extend in parallel around the outer periphery of integrated circuit 78.

Figure 32:
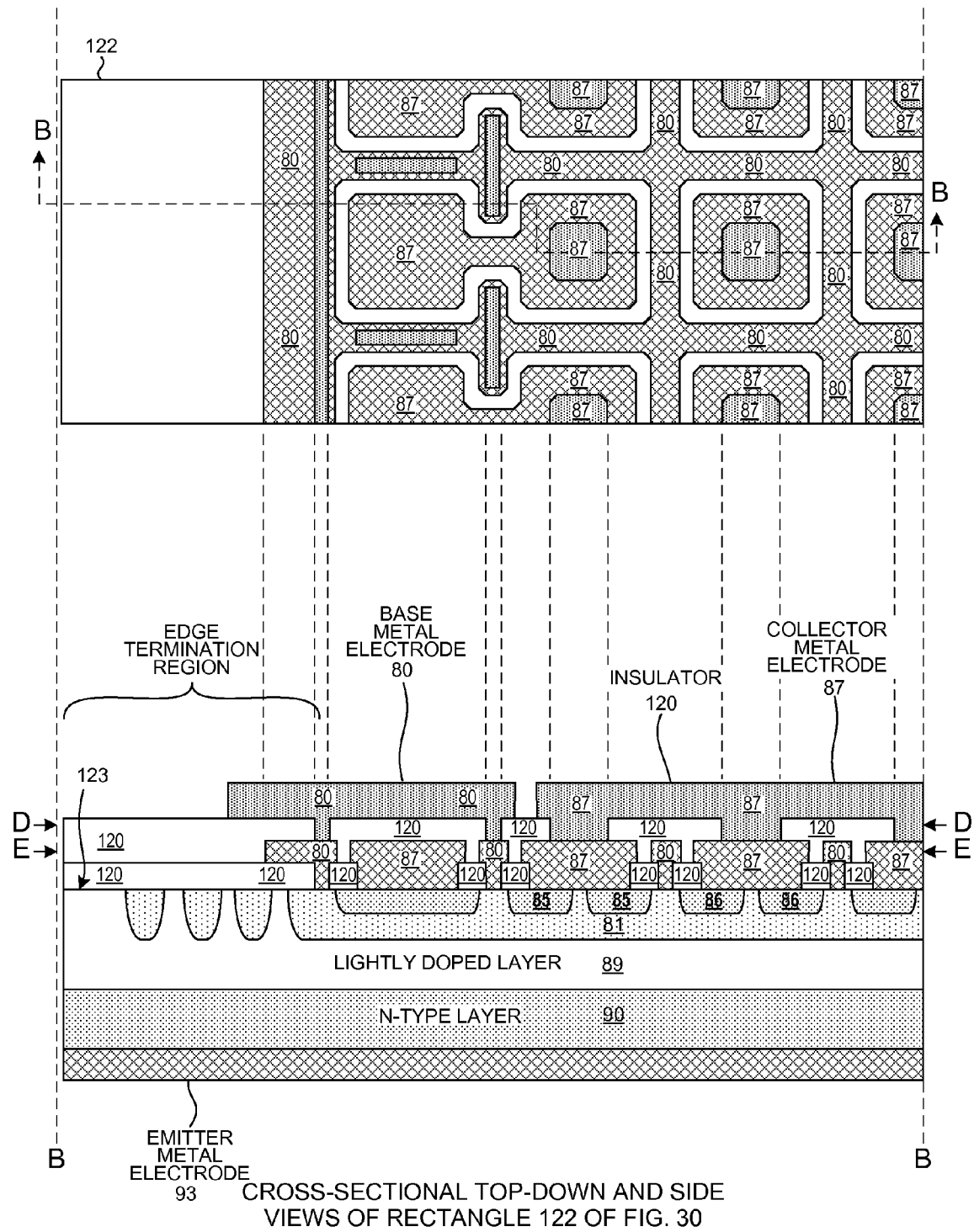
FIG. 32 is a diagram of the rectangle portion 122 of the integrated circuit 78 of FIG. 30 taken along certain sections.

FIG. 32 is another diagram of the rectangle portion 122 of FIG. 30. The cross-sectional side view at the bottom of FIG. 32 is taken along the sectional line B-B in the top view of FIG. 32. The cross-sectional top-down view at the top of FIG. 32 is taken along the sectional lines D-D and E-E in the bottom view of FIG. 31. Each N-type collector region in the center portion of integrated circuit 78 is entirely surrounded by the base metal electrode 80. From a top-down perspective, the base contact between the base metal electrode 80 and the underlying semiconductor material (at surface 123) has a two-dimensional grid structure of horizontally extending strips and vertically extending strips. Within each of the squares formed by this two-dimensional grid, and extending down into the semiconductor material from surface 123, is one of the substantially square-shaped N-type collector regions. In this example, the width of the base contact is about 1.5 microns. The lateral distance between adjacent N-type collector regions is about 2.0 microns.

Figure 33:
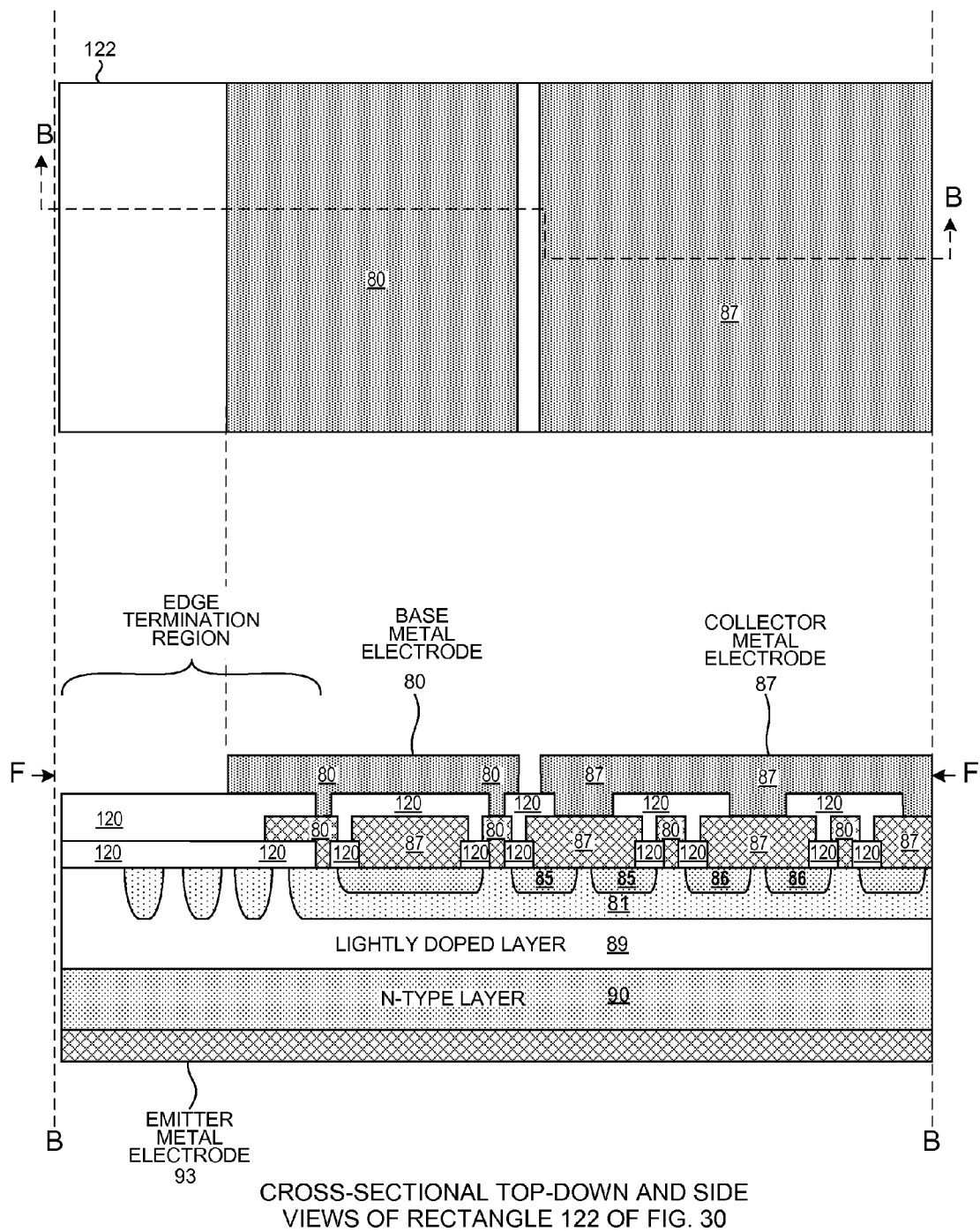
FIG. 33 is a diagram of the rectangle portion 122 of the integrated circuit 78 of FIG. 30 taken along certain sections.

FIG. 33 is another diagram of the rectangle portion 122 of FIG. 30. The cross-sectional side view at the bottom of FIG. 33 is taken along the sectional line B-B in the top view of FIG. 33. The cross-sectional top-down view at the top of FIG. 33 is taken along the sectional line F-F in the bottom view of FIG. 33.

FIG. 34 is a table that sets forth doping concentrations in the various regions of the structure of FIG. 30.

Figure 35:
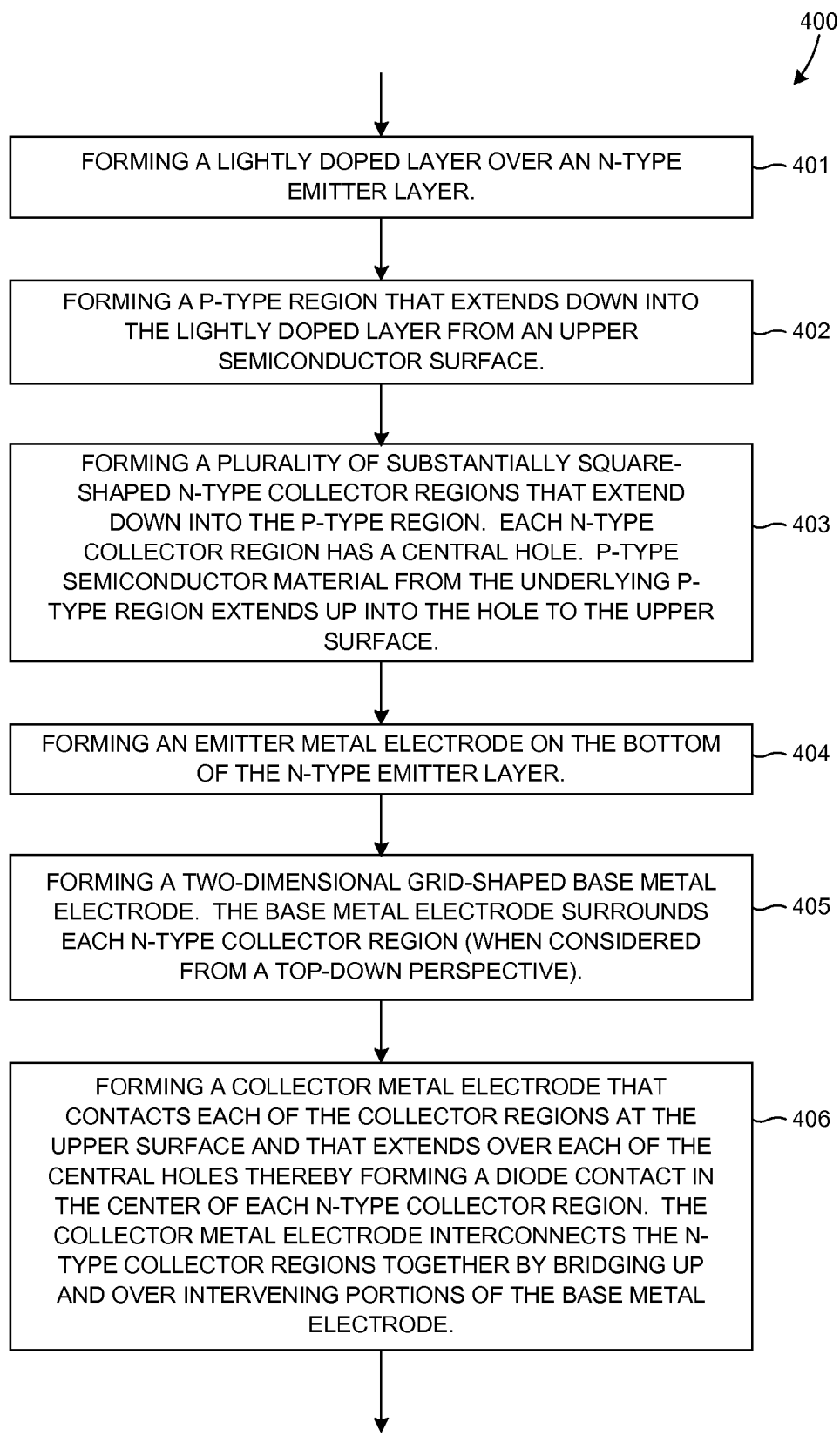
FIG. 35 is a simplified flowchart of a method 400 in accordance with one novel aspect.

FIG. 35 is a simplified flowchart of a method 400 of manufacturing an RBJT/diode integrated circuit in accordance with one novel aspect. A lightly doped layer is formed (step 401) over an N-type emitter layer. A P-type region is formed (step 402) to extend down into the lightly doped layer from an upper surface of the semiconductor portion of the integrated circuit. A plurality of N-type collector regions are formed (step 403) to extend down into the P-type region from the upper surface. Each N-type collector region has a central hole. P-type semiconductor material from the underlying P-type region extends up into the hole from the bottom and to the upper surface. An emitter metal electrode is formed (step 404) on a side (bottom side) of the N-type emitter layer opposite the lightly doped layer. A two-dimensional grid-shaped base metal electrode is formed (step 405) to surround each N-type collector region when the integrated circuit is considered from a top-down perspective. A collector metal electrode is formed (step 406) so that the collector metal electrode contacts each N-type collector region and also extends over the hole in the center of the N-type collector region, thereby forming a diode contact in the center of each N-type collector region. The collector metal electrode also bridges up and over intervening portions of the base metal electrode to interconnect all the N-type collector regions. In one example, the integrated circuit structure manufactured in the method 400 is the RBJT/diode integrated circuit 78 structure pictured in FIGS. 30-33. The references above and in FIG. 35 to extending "over, to extending "down", to the "upper" surface, to the "underlying" P-type region, and so forth are used to describe relative orientations between different parts of the structure being described, and it is to be understood that the overall structure being described can actually be oriented in any way in three-dimensional space. The steps set forth above in FIG. 35 can be performed in any order so long as the same desired RBJT/diode integrated circuit 78 results.

Although certain specific embodiments are described above for instructional purposes, the teachings of this patent document have general applicability and are not limited to the specific embodiments described above. Although the LFVR is described above in an application involving a specific flyback converter power supply, the LFVR is of general applicability in other circuits including other power supply circuit topologies. Although an example is set forth above where the base current injection circuit is implemented using a current transformer, the base current injection circuit can be implemented in other ways. Although the RBJT/diode integrated circuit is described above in connection an example in which the bipolar transistor is a NPN transistor, in another example the bipolar transistor of the RBJT is a PNP transistor. Accordingly, various modifications, adaptations, and combinations of various features of the described embodiments can be practiced without departing from the scope of the invention as set forth in the claims.

What is claimed is:

1. An integrated circuit comprising:
  a semiconductor portion having a substantially planar upper surface, the semiconductor portion comprising:
    an N-type layer;
    a lightly doped layer disposed over the N-type layer;
    a P-type region extending into the lightly doped layer from the upper surface; and
    a plurality of N-type regions extending from the upper surface and into the P-type region, wherein each of the N-type regions has a peripheral boundary at the upper surface, wherein said each N-type region forms a central hole such that the P-type region extends up to the upper surface through the hole in said each N-type region, wherein the central hole is the only hole in said each N-type region, and wherein the N-type regions are disposed in an array;
  a first metal electrode that extends over at least a central portion of each of the N-type regions and also extends over the central hole in said each N-type region thereby making contact with the P-type region at the upper surface of the semiconductor portion in said central hole and thereby also making contact with said each N-type region at the upper surface of the semiconductor portion;
  a second metal electrode that surrounds the peripheral boundary of each of the N-type regions, wherein the second metal electrode contacts the P-type region around the peripheral boundary of each of the N-type regions; and a third metal electrode that is disposed on an opposite side of the lightly doped layer from the first and second metal electrodes.

2. The integrated circuit of claim 1, wherein the peripheral boundary of each N-type region has a substantially square shape.

3. An integrated circuit comprising:

a bipolar junction transistor (BJT) having a plurality of collector regions, a collector metal electrode coupled to the collector regions, a base region, a base metal electrode coupled to the base region, an emitter region, and an emitter metal electrode coupled to the emitter region, wherein the (BJT) has an emitter-to-base reverse breakdown voltage of at least twenty volts and an emitter-to-collector reverse breakdown voltage of at least twenty volts, and wherein the collector metal electrode contacts one of the collector regions, and then bridges over a part of the base metal electrode, and makes contact with another of the collector regions; and a distributed parallel diode having an anode coupled to the collector regions of the BJT and having a cathode coupled to the emitter region of the BJT, and wherein the distributed parallel diode comprises a plurality of PN junctions that are distributed across a semiconductor surface of the integrated circuit.

4. The integrated circuit of claim 3, wherein each of the collector regions has an annular shape and forms a central hole, wherein the central hole is the one and only hole formed in said each collector region, and wherein a corresponding one of the plurality of PN junctions is disposed underneath the central hole such that a current flow through the PN junction can flow from the collector metal electrode, through the central hole, through the PN junction, and to the emitter metal electrode.

5. The integrated circuit of claim 4, wherein a portion of the collector metal electrode is a first bond pad, and wherein a portion of the base metal electrode is a second bond pad.

6. The integrated circuit of claim 5, wherein the annular shape has a substantially square outer peripheral boundary, and wherein the central hole is centered within the annular shape.

7. An integrated circuit comprising:

a bipolar junction transistor having an emitter-to-base reverse breakdown voltage of at least twenty volts and having an emitter-to-collector reverse breakdown voltage of at least twenty volts, wherein the bipolar junction transistor has a plurality of N-type collector regions; and means for providing a diode in parallel with the bipolar junction transistor such that an anode of the diode is coupled to the collector regions of the bipolar transistor, and such that a cathode of the diode is coupled to an emitter of the bipolar transistor, wherein the means involves a plurality of PN junctions that are distributed across the integrated circuit.

8. The integrated circuit of claim 7, wherein the means is a distributed diode structure, and wherein the distributed diode structure comprises the plurality of PN junctions.

9. An integrated circuit comprising:

a bipolar junction transistor having an emitter-to-base reverse breakdown voltage of at least twenty volts and having an emitter-to-collector reverse breakdown voltage of at least twenty volts, wherein the bipolar junction transistor has a plurality of N-type collector regions; and means for providing a diode in parallel with the bipolar junction transistor such that an anode of the diode is coupled to the collector regions of the bipolar transistor, and such that a cathode of the diode is coupled to an emitter of the bipolar transistor, wherein the means involves a plurality of PN junctions that are distributed across the integrated circuit, wherein each of the N-type collector regions has a central hole, and wherein a diode contact is present at a metal-to-semiconductor boundary at a top of each said central hole.

10. The integrated circuit of claim 9, wherein the diode comprises the plurality of PN junctions.

11. The integrated circuit of claim 10, wherein each of the N-type collector regions has a peripheral boundary, and wherein the peripheral boundary has a substantially square shape.

12. An integrated circuit comprising:

a semiconductor portion having a substantially planar upper surface, the semiconductor portion comprising:
an N-type layer;
a lightly doped layer disposed over the N-type layer;
a P-type region extending into the lightly doped layer from the upper surface;
a plurality of N-type regions extending from the upper surface and into the P-type region, wherein each of the N-type regions has a peripheral boundary at the upper surface, wherein said each N-type region forms a central hole such that the P-type region extends UP to the upper surface through the hole in said each N-type region, wherein the central hole is the only hole in said each N-type region, and wherein the N-type regions are disposed in an array;
a first metal electrode that extends over at least a central portion of each of the N-type regions and also extends over the central hole in said each N-type region thereby making contact with the P-type region at the upper surface of the semiconductor portion in said central hole and thereby also making contact with said each N-type region at the upper surface of the semiconductor portion;
a second metal electrode that surrounds the peripheral boundary of each of the N-type regions, wherein the second metal electrode contacts the P-type region around the peripheral boundary of each of the N-type regions; and
a third metal electrode that is disposed on an opposite side of the lightly doped layer from the first and second metal electrodes, wherein the integrated circuit comprises a distributed diode structure, and wherein the distributed diode structure is structured such that a current flow through the distributed diode structure can flow from the first metal electrode and then through the central holes in the plurality of N-type regions and then down through the lightly doped layer and then down through the N-type layer to the third metal electrode.

13. The integrated circuit of claim 12, wherein the second metal electrode forms a two dimensional grid structure involving first parallel metal strip portions extending in a first direction and second parallel metal strip portion extending in a second direction perpendicular to the first direction, wherein the first and second parallel metal strip portions intersect one another, and wherein the first metal electrode bridges over the two dimensional grid structure to make contact with each of the plurality of N-type regions at the upper surface of the semiconductor portion.

14. The integrated circuit of claim 13, wherein the integrated circuit comprises a bipolar junction transistor structure, wherein the bipolar junction transistor has a reverse breakdown voltage between the second metal electrode and the third metal electrode of at least twenty volts, and wherein the bipolar junction transistor has a reverse breakdown voltage between the first metal electrode and the third metal electrode of at least twenty volts.

15. The integrated circuit of claim 14, wherein a portion of the first metal electrode is a first bond pad, and wherein a portion of the second metal electrode is a second bond pad.

16. A method of manufacturing an integrated circuit comprising:
   forming a lightly doped layer so that the lightly doped layer is disposed over an N-type emitter layer;
   forming a P-type region that extends down into the lightly doped layer from an upper surface of a semiconductor portion of the integrated circuit;
   forming a plurality of N-type collector regions that extend down into the P-type region from the upper surface, wherein each of the N-type collector regions has a peripheral boundary at the upper surface, wherein each N-type collector region has a central hole, wherein P-type semiconductor material from the underlying P-type region extends up into the central hole to the upper surface, wherein the central hole is the only hole in said each N-type collector region, and wherein the N-type regions are disposed in an array;
   forming an emitter metal electrode on the N-type emitter layer on an opposite side of the N-type layer from the lightly doped layer;
   forming a two-dimensional grid-shaped base metal electrode, wherein the grid-shaped base metal electrode surrounds each of the N-type collector regions from a top-down perspective and contacts the P-type region around the peripheral boundary of each of the N-type collector regions; and
   forming a collector metal electrode that contacts each of the N-type collector regions and that extends over each of the central holes thereby forming a diode contact in the center of each N-type collector region at the upper surface of the semiconductor portion, wherein the collector metal electrode couples adjacent ones of the N-type collector regions together by bridging up and over an intervening portion of the base metal electrode.

17. The method of claim 16, wherein the integrated circuit is formed such that a bipolar junction transistor is formed and a parallel-connected distributed diode is formed, wherein an anode of the parallel-connected distributed diode is coupled to the collector metal electrode, and wherein a cathode of the parallel-connected distributed diode is coupled to the emitter metal electrode.

18. The method of claim 16, wherein the bipolar junction transistor has an emitter-to-base reverse breakdown voltage of at least twenty volts, and wherein the bipolar junction transistor has an emitter-to-collector reverse breakdown voltage of at least twenty volts.

19. The method of claim 16, further comprising:
   coupling the collector metal electrode to a first winding of a current transformer; and
   coupling the base metal electrode to a second winding of the current transformer.

* * * * *